United States Patent
von Ammon et al.

(10) Patent No.: US 6,238,477 B1
(45) Date of Patent: May 29, 2001

(54) PROCESS AND DEVICE FOR THE PRODUCTION OF A SINGLE CRYSTAL

(75) Inventors: Wilfried von Ammon, Hochburg/Ach (AT); Erich Tomzig, Burgkirchen; Janis Virbulis, Burghausen, both of (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/520,290

(22) Filed: Mar. 7, 2000

Related U.S. Application Data

(62) Division of application No. 09/206,061, filed on Dec. 4, 1998, now Pat. No. 6,132,507.

(30) Foreign Application Priority Data

Dec. 18, 1997 (DE) .............................. 197 56 613

(51) Int. Cl.[7] ..................... C30B 15/20
(52) U.S. Cl. .............. 117/13; 117/14; 117/217; 117/218
(58) Field of Search .............. 117/13, 14, 217, 117/218

(56) References Cited

U.S. PATENT DOCUMENTS

| | | |
|---|---|---|
| 2,852,420 | 9/1958 | Pohl . |
| 4,597,949 | 7/1986 | Jasinski et al. . |
| 5,132,091 * | 7/1992 | Azad ........................... 117/217 |
| 5,137,699 * | 8/1992 | Azod . |
| 5,152,867 * | 10/1992 | Kitaura et al. . |
| 5,260,037 * | 11/1993 | Kitaura et al. . |
| 5,441,014 * | 8/1995 | Tomioka et al. .................. 117/213 |
| 5,853,480 * | 12/1998 | Kubota et al. .................. 117/217 |
| 5,972,106 * | 10/1999 | Ohta et al. ...................... 117/13 |

FOREIGN PATENT DOCUMENTS

| | | |
|---|---|---|
| 198 06 045 | 8/1998 | (DE) . |
| 0811707 | 12/1997 | (EP) . |
| 0866150 | 9/1998 | (EP) . |
| 1316 707 | 4/1963 | (FR) . |
| WO 92/18672 | 10/1992 | (WO) . |

OTHER PUBLICATIONS

E. Dornberger, W. von Ammon in Electrochemical Society, vol. 143, No. 5 (1996).
English Patent Abstract of Japan corresponding to JP 60027684.
Patent Abstracts of Japan, vol. 018, No. 244, May 10, 1994, & JP 06027684 (Tokyo Awrakogyo Co. Ltd.), Feb. 4, 1994.
Patent Abstracts of Japan, vol. 7, No. 118, May 21, 1983, & JP 58 036998 (Toshiba Ceramics Co., Mar. 4, 1953.
Patent Abstracts of Japan, vol. 018, No. 575, Nov. 4, '94, & JP 0621591 (Nippon Steel Co.&piotners. 01) Aug. 2, 1994.

* cited by examiner

Primary Examiner—Felisa Hiteshew
(74) Attorney, Agent, or Firm—Collard & Roe, P.C.

(57) ABSTRACT

A process and device for the production of a single crystal of semiconductor material is by pulling the single crystal from a melt, which is contained in a crucible and is heated by a side heater surrounding the crucible. The melt is additionally heated, in an annular region around the single crystal, by an annular heating device which surrounds the single crystal and is positioned above the melt.

5 Claims, 1 Drawing Sheet

US 6,238,477 B1

PROCESS AND DEVICE FOR THE PRODUCTION OF A SINGLE CRYSTAL

This is a divisional of application Ser. No. 09/206,061 filed on Dec. 4, 1998 now U.S. Pat. No. 6,132,507.

BACKGROUND OF THE INVENTION

1. Field of the Invention

The present invention relates to a process and to a device for the production of a single crystal of semiconductor material by pulling the single crystal from a melt, which is contained in a crucible and is heated by a side heater surrounding the crucible.

2. The Prior Art

This process for producing single crystals is referred to as the Czochralski method. It is already known that the incidence of specific types of defects in single crystals which are grown depends on the pull rate V and the axial temperature gradient G at the phase boundary between the single crystal and the melt. If the conditions during the pulling of the single crystal are such that the condition $V/G<C_{crit}$ is satisfied, $C_{crit}$ being a constant, then a majority of interstitial defects, known as large pits, are formed (E. Dornberger, W. v. Ammon in Electrochemical Society, Vol. 143, No. 5 (1996)). This type of defect, referred to below as L-defects, can greatly reduce the yield of functional electronic components which are produced by further processing the single crystal. The condition indicated above makes it clear that, in order to avoid the occurrence of L defects, attempts should be made to keep the pull rates as high as possible.

However, when pulling a single crystal, it is found that the pull rate can only be increased up to a certain degree without unacceptably altering the way in which the single crystal grows. Specifically, at excessive growth rates, the single crystal starts to lose the desired cylindrical growth and starts to grow in an imperfectly round shape. Thus instead of forming a cylindrical lateral surface, the single crystal starts to form plane crystal faces corresponding to its crystallographic orientation. Further, growth which is not perfectly round increases the risk of producing crystal lattice defects in the pulled material which renders it unusable.

SUMMARY OF THE INVENTION

It is an object of the present invention to provide a process for delaying the transition from cylindrical growth to growth which is not perfectly round until higher growth rates are reached than were hitherto known.

This object is achieved by the present invention which relates to a process for the production of a single crystal of semiconductor material by pulling the single crystal from a melt, which is contained in a crucible and is heated by a side heater surrounding the crucible, wherein the melt is additionally heated, in an annular region around the single crystal, by an annular heating device or means which surrounds the single crystal and is positioned above the melt.

The process of the invention increases the availability of cylindrically shaped single crystals which are substantially free from L-defects. It is particularly advantageous to use this process for the production of silicon single crystals with large diameters, for example with diameters of 200 mm, 300 mm or 400 mm.

The present invention is also directed to a device for carrying out the process of the invention, wherein an annular heating device which surrounds the single crystal, is positioned above the melt and emits radiation which heats the melt in an annular region around the single crystal.

The annular heating device or means is advantageously positioned above the melt in such a way that the distance between the single crystal and the heating device is less than the distance between the heating device and the wall of the crucible. It is particularly preferable if the distance between the annular heating device and the single crystal is as small as possible, and measures for example only 3 cm.

In another embodiment, it is further preferable if the heating device or means is fastened to the lower edge of a thermally insulating heat shield which screens the single crystal against heat radiation from the side heater. Care should be taken that the heating device heats only the melt, and not the single crystal. Where appropriate, therefore, thermal insulation, for example the heat shield, should be provided between the single crystal and the heating device. The distance between the annular heating device and the surface of the melt is preferably from 10 to 20 mm.

The annular heating device heats the melt in an adjacent surface region lying around the single crystal. It therefore produces a steep axial temperature gradient in the melt, between the single crystal and the crucible. This promotes cylindrical growth of the single crystal.

In a further embodiment, the annular heating device or means may be used to deliver part of the energy needed to produce the melt, and to reduce the time necessary to melt the semiconductor material.

In another embodiment, the heating power of the side heater and, where appropriate, a bottom heater, which is positioned under the crucible, is reduced when the melt is additionally heated by the annular heating device or means. Hence it is possible for the material of the crucible, which usually consists of quartz glass and is attacked by the hot melt, to be protected from premature corrosion. The reduced corrosion rate of the crucible has a favorable effect on the yield of monocrystalline semiconductor material.

In a further embodiment, due to its low thermal inertia, the annular heating device or means can preferably be used for rapid power control. This in turn influences the diameter growth and the pull rate. Therefore, fluctuations in diameter and pull rate can be reduced considerably.

BRIEF DESCRIPTION OF THE DRAWINGS

Other objects and features of the present invention will become apparent from the following detailed description considered in connection with the accompanying drawing which discloses two embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
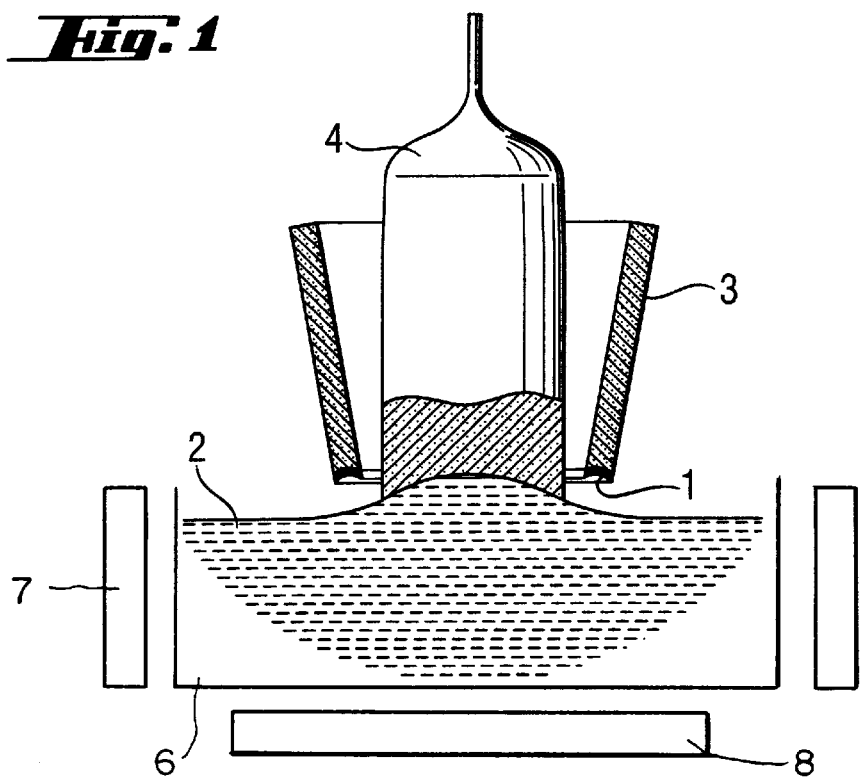
FIG. 1 schematically shows a first embodiment of the invention.

Turning now in detail to the drawings, FIG. 1 shows the annular heating device or means constructed in a first embodiment as a reflector 1 above the melt 2. Reflector 1 is fastened to the lower edge of a thermal insulator 3 and reflects heat radiation toward the melt. The reflector is positioned at a small distance from the single crystal 4 and around the single crystal. Preferably the reflector 1 completely surrounds the single crystal 4. By means of the reflected heat radiation, the melt is heated in an annular region around the single crystal. The melt 2 is contained in crucible 6 which is surrounded by side heater 7, and an optional bottom heater 8 is also present.

Figure 2:
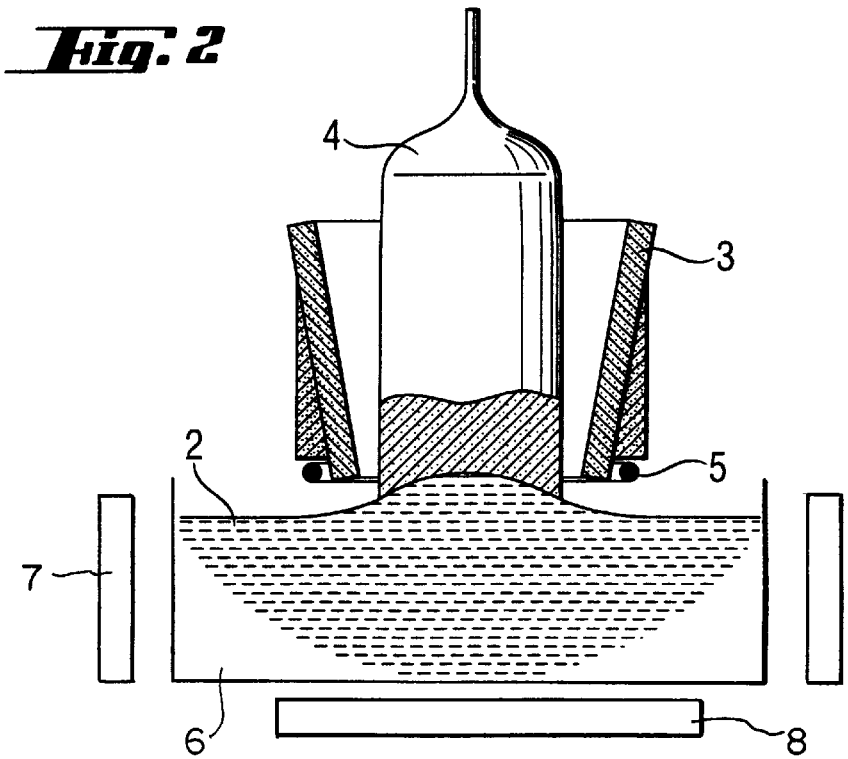
FIG. 2 schematically shows a second preferred embodiment of the invention.

In a second embodiment, the annular heating device or means, as shown in FIG. 2 may be constructed as an active heater 5. It may be a resistance heater, for example made of graphite or molybdenum; or it can be an induction heater operated with radio frequency alternating currents. The induction heater preferably is made of a material which is stable at high temperatures and has high electrical conductivity. For example, the induction heater can be made of molybdenum, tungsten or tantalum, or can be constructed as a water-cooled copper tube or silver tube.

Accordingly, while a few embodiments of the present invention have been shown and described, it is to be understood that many changes and modifications may be made thereunto without departing from the spirit and scope of the invention as defined in the appended claims.

What is claimed is:

1. A process for the production of a single crystal of semiconductor material comprising providing a crucible having a wall and containing a melt of semiconductor material;

pulling the single crystal from the melt;

heating the melt using a side heater surrounding the crucible;

additionally heating the melt in an annular region around the single crystal using an annular heating means which surrounds the single crystal and is positioned above the melt; and positioning the annular heating means in such a way that the annular heating means heats only the melt and not the single crystal, and providing a distance between the single crystal and the annular heating means which is less than a distance between the annular heating means and the wall of the crucible.

2. The process as claimed in claim 1, further comprising reducing heating power of the side heater and, optionally of a bottom heater, when the melt is additionally heated by the annular heating device.

3. The process as claimed in claim 2, further comprising using the annular heating device for rapid control of the heating power.

4. The process as claimed in claim 1, further comprising producing the melt before pulling the single crystal; and providing part of the heat needed for producing the melt by using the annular heating device.

5. Process as claimed in claim 1, further comprising that an oxygen content in a growing crystal is varied by adjusting a heating power of the annular heating means in conjunction with heating power of the side heater and, optionally, a bottom heater.

* * * * *